(12) United States Patent
Chinavare et al.

(10) Patent No.: US 10,023,137 B2
(45) Date of Patent: Jul. 17, 2018

(54) CABLE ASSEMBLY FOR AN ELECTRIC VEHICLE THAT INCLUDES FLOOR SUPPORTED AND SUB-FLOOR COMPONENTS

(71) Applicant: Ford Global Technologies, LLC, Dearborn, MI (US)

(72) Inventors: James Ryan Chinavare, Chelsea, MI (US); Alejandro Barraza, Canton, MI (US); Christopher John Mazur, Northville, MI (US); Gilbert Portalatin, South Lyon, MI (US); Timothy DeBastos, Royal Oak, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/226,957

(22) Filed: Aug. 3, 2016

(65) Prior Publication Data
US 2016/0339855 A1 Nov. 24, 2016

Related U.S. Application Data

(62) Division of application No. 13/421,374, filed on Mar. 15, 2012, now abandoned.

(60) Provisional application No. 61/578,857, filed on Dec. 21, 2011.

(51) Int. Cl.
| | | |
|---|---|---|
| *B60R 16/02* | (2006.01) | |
| *B60K 1/04* | (2006.01) | |
| *B60L 11/18* | (2006.01) | |
| *H02K 5/22* | (2006.01) | |
| *H05K 9/00* | (2006.01) | |

(52) U.S. Cl.
CPC ............ B60R 16/0222 (2013.01); B60K 1/04 (2013.01); B60L 11/1877 (2013.01); H02K 5/225 (2013.01); H05K 9/0098 (2013.01); *B60K 2001/0416* (2013.01); *B60K 2001/0438* (2013.01); *B60Y 2410/115* (2013.01)

(58) Field of Classification Search
CPC ........... H05K 9/0098; H02G 3/00; B60K 1/04
See application file for complete search history.

(56) References Cited

U.S. PATENT DOCUMENTS

| | | | |
|---|---|---|---|
| 4,026,379 A | 5/1977 | Dunn | |
| 6,161,891 A | 12/2000 | Blakesley | |
| 6,429,544 B1 | 8/2002 | Sasaki et al. | |
| 6,933,440 B2 * | 8/2005 | Ichikawa | B60R 16/0215 174/135 |
| 7,563,981 B2 | 7/2009 | Ichikawa et al. | |
| 7,775,311 B1 | 8/2010 | Hardy et al. | |
| 8,119,908 B2 | 2/2012 | Lacombe et al. | |

(Continued)

*Primary Examiner* — William H Mayo, III
*Assistant Examiner* — Hiram E Gonzalez
(74) *Attorney, Agent, or Firm* — David B. Kelley; Brooks Kushman P.C.

(57) ABSTRACT

A power supply cable including high voltage wires and connectors for a traction motor, charger, upper battery pack and lower battery pack. The power supply cable includes a clamshell shield housing that protects the cable as it is routed over a rear seat pedestal. A two-piece grommet is provided to seal between the passenger compartment and the underbody of the vehicle and includes a rigid attachment ring and a seal that seals the passenger compartment from the environment below the vehicle.

5 Claims, 4 Drawing Sheets

(56) References Cited

U.S. PATENT DOCUMENTS

| | | |
|---|---|---|
| 9,162,558 B2 | 10/2015 | Stenberg et al. |
| 2010/0045106 A1 | 2/2010 | Oga et al. |
| 2011/0094796 A1 | 4/2011 | Toyama et al. |
| 2011/0133548 A1* | 6/2011 | Toyama .............. B60R 16/0215 307/9.1 |
| 2011/0300427 A1* | 12/2011 | Iwasa ...................... B60K 1/04 429/99 |

* cited by examiner

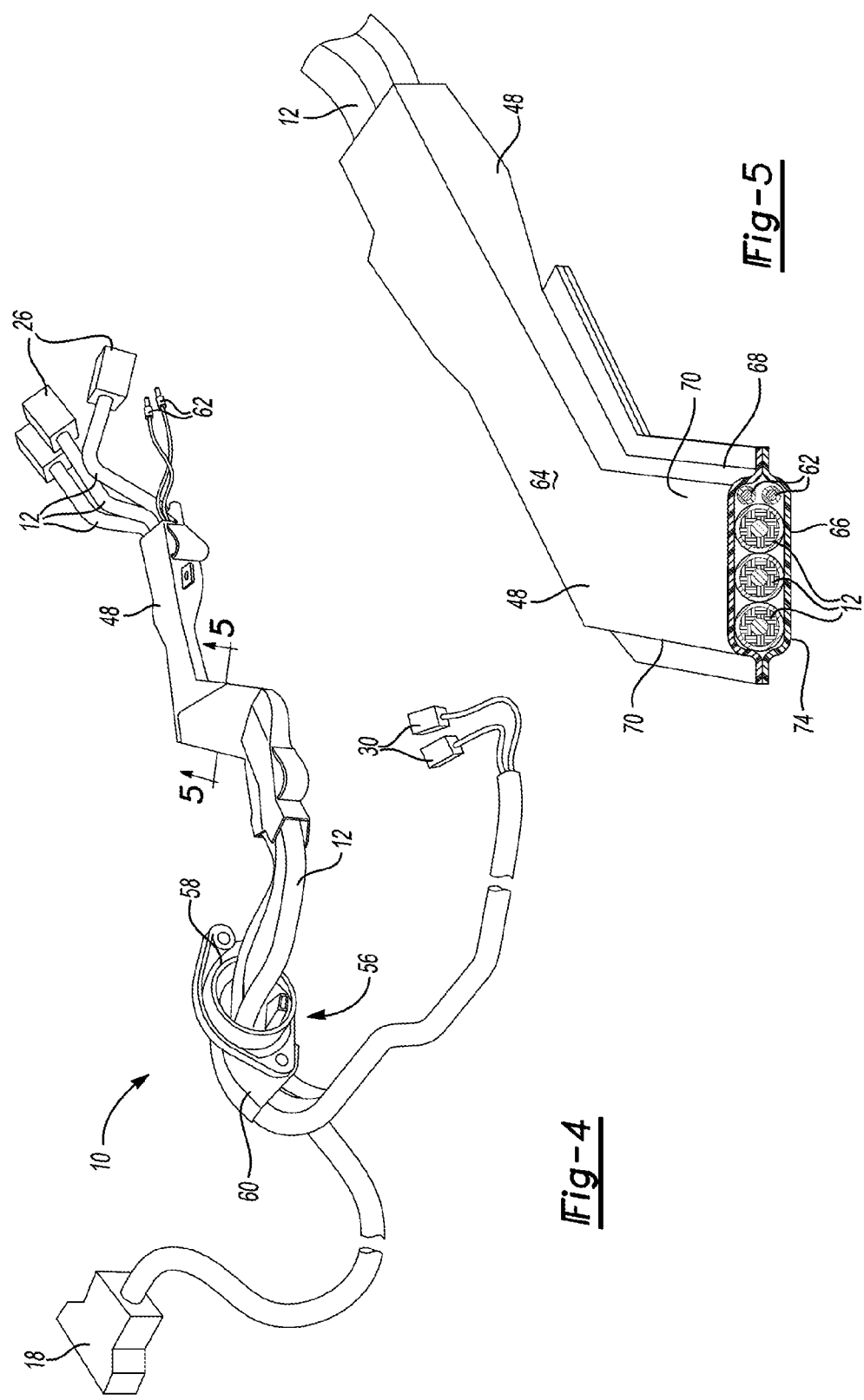

CABLE ASSEMBLY FOR AN ELECTRIC VEHICLE THAT INCLUDES FLOOR SUPPORTED AND SUB-FLOOR COMPONENTS

CROSS-REFERENCE TO RELATED APPLICATIONS

This application is a divisional of U.S. application Ser. No. 13/421,374 filed Mar. 15, 2012, which claims the benefit of U.S. provisional Application No. 61/578,857 filed Dec. 21, 2011, the disclosures of which are incorporated in their entirety by reference herein.

TECHNICAL FIELD

This disclosure relates to a high voltage wiring harness assembly that connects a vehicle battery in a battery compartment to sub-floor portions of the battery electric vehicle.

BACKGROUND

Electric vehicles having a battery that provides power to a traction motor may be hybrid electric vehicles (HEV) or battery electric vehicles (BEV). High voltage batteries provide increased range that is desirable, particularly for BEVs. High voltage batteries require a large number of battery cells to obtain, for example, an output of 400 amps at 330 volts. The increased number of cells increases the space requirements for the battery.

One way to accommodate the increased size of the battery is to assemble the battery to the vehicle with an upper part of the battery inside the vehicle and a lower part of the battery outside the vehicle below the floor of the battery compartment. With this arrangement, the wiring harness for the vehicle must be routed through the floor of the vehicle. The upper and lower parts of the battery must be cabled together.

In addition, high voltage cables must be connected to the traction motor and the charge receptacle. It is a challenge to package the high voltage cables within the vehicle while providing a cable to the traction motor away from surrounding components in the motor compartment and underbody components. In addition, any parts of the high voltage cables that pass through the passenger compartment must be shielded and any reduction of the space available in the passenger compartment must be minimized.

This disclosure is directed to the above challenges and other challenges as summarized below.

SUMMARY

The wiring harness disclosed, as an example, includes 35 $mm^2$ cables with high voltage connectors. The wiring between an upper portion of the battery and a lower portion of the battery is routed through the side of the rear seat from under the vehicle and underneath the rear seat pan without raising the height of the rear seat or interfering with the rear seat pan. The high voltage cables are routed to a central point on the battery pack that is behind an intermediate portion of the rear seat.

The high voltage wiring harness is routed away from other underbody components through shields and grommets for robustness and to provide a consistent assembly process. Similarly, the high voltage wiring harness in the motor compartment is routed away from brake lines, cooling lines and other components.

According to one aspect of the disclosure, a shield is provided for a wiring harness including a plurality of wires that are routed over a seat pedestal for a seat of an electric vehicle. The shield comprises a housing having a top wall, a bottom wall and a plurality of side walls. The side walls are limited in height spacing the top wall from the lower wall to accommodate the width of the widest of the plurality of wires and minimize the height of the housing.

According to other aspects of the disclosure relating to the shield, the top wall may be separated from the housing to facilitate assembling the wires inside the housing. The housing may be a clamshell structure with the top wall being provided on a first part of the clamshell structure and with the lower wall being provided on a second part of the clamshell structure. The side walls may be split into two parts with a first part being separated from the housing with the top wall and a second part remaining with the lower wall. The housing may be rectangular in cross-section and the plurality of wires may be laterally aligned within the housing.

The shield disposed on the seat pedestal is at least partially covered by a rear seat pan that is attached to the top of the seat pedestal.

According to another aspect of the disclosure, a wiring harness is provided for an electric vehicle having a battery compartment disposed behind a seat. The wiring harness comprises an electrically powered traction motor, a battery pack and a shield. The battery pack includes an upper stack of battery cells that are connected to a lower stack of battery cells by a first set of wires. The battery pack is also connected by a second set of wires to the traction motor. The first set of wires is connected to the battery at a transversely central point on the battery. The shield partially encloses the first set of wires as the wires are routed across a top portion of a seat pedestal to a side of the seat pedestal. The side of the seat pedestal defines an opening and the first set of wires extends from inside the vehicle to the outside of the vehicle.

According to other aspects of the disclosure as it relates to the wiring harness, the shield may be a housing that includes at least two parts that are assembled together to form an enclosure for the wires that is has a height that is less than a width of the enclosure. The housing may be a two part clamshell housing that includes a base portion and a top portion that are assembled together about the wires to form a rectangular housing. The wires may be laterally aligned within the rectangular housing.

A grommet and a seal may be assembled to the wiring harness that is assembled within the opening defined in the seat pedestal. The grommet may be a rigid member and the seal may be a flexible member that is disposed between the grommet and the first set of wires.

The first set of wires may not be enclosed within a housing between the shield and the seal where the first set of wires is routed along the side of the seat pedestal.

These and other aspects of the disclosure as summarized above are more fully disclosed below with reference to the attached drawings and the detailed description of the illustrated embodiments.

BRIEF DESCRIPTION OF THE DRAWINGS

FIG. 4 is a perspective view of a portion of a power supply cable interconnecting a traction motor connector with an upper and a lower battery pack connector; and FIG. 5 is a partially cross-section fragmentary perspective view of a part of a wire harness including a clamshell shield housing that may be assembled to a rear seat pedestal.

DETAILED DESCRIPTION

A detailed description of the illustrated embodiments of the present invention is provided below. The disclosed embodiments are examples of the invention that may be embodied in various and alternative forms. The figures are not necessarily to scale. Some features may be exaggerated or minimized to show details of particular components. The specific structural and functional details disclosed in this application are not to be interpreted as limiting, but merely as a representative basis for teaching one skilled in the art how to practice the invention.

Figure 1:
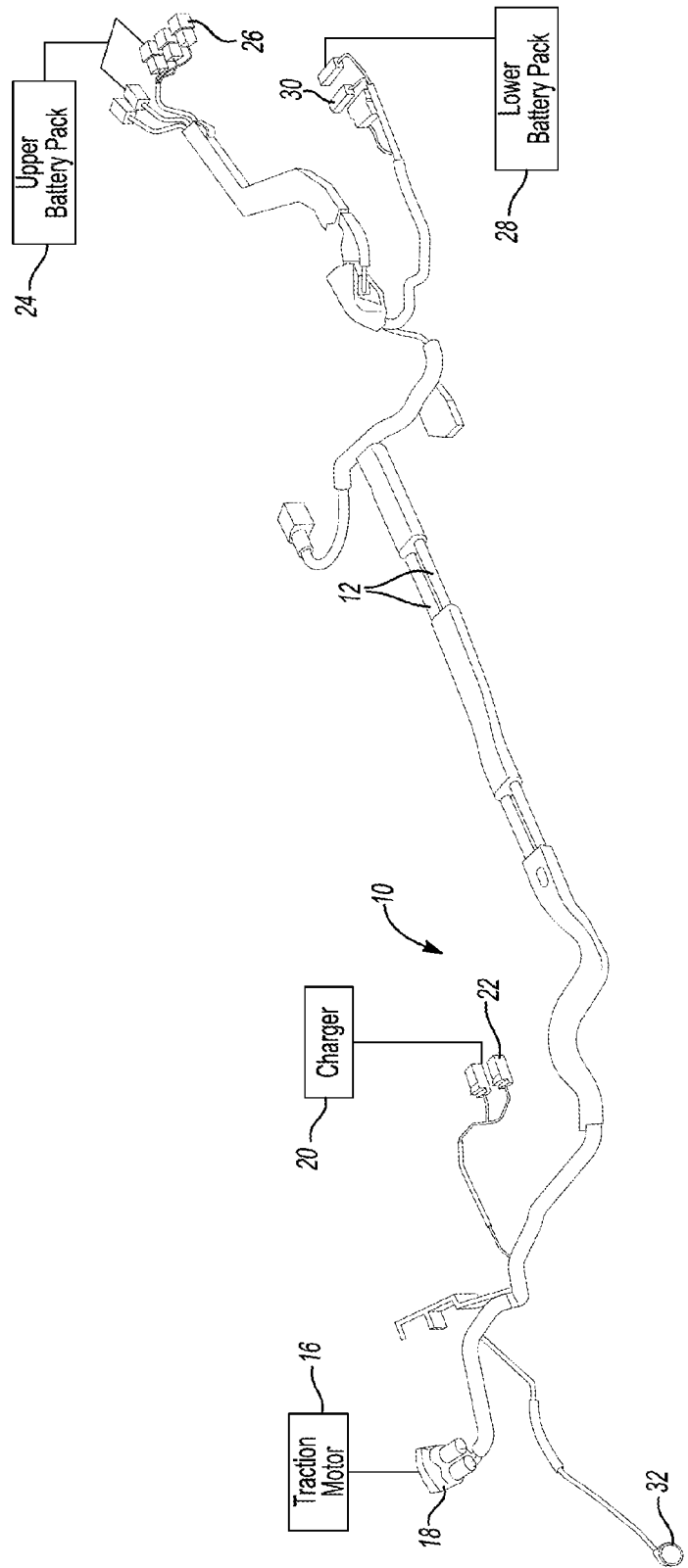
FIG. 1 is a perspective view of a power supply cable for a battery electric vehicle.

Referring to FIG. 1, a power supply cable 10 that includes high voltage wires (HV wires) 12 that are used to provide power for a battery electric vehicle (BEV) are illustrated in isolation.

The power supply cable 10 provides power to a traction motor 16. The power supply cable 10 includes a traction motor connector 18 that is connected to the traction motor 16. The power supply cable 10 is also connected to a charger 20 that includes a charger connector 22 that is connected to the charger 20 or charge receptacle. An upper battery pack 24 is connected by upper battery pack connectors 26 that are part of the power supply cable 10. A lower battery pack 28 is connected by lower battery pack connectors 30 that are part of the power supply cable 10. A charger ground wire 32 is also part of the power supply cable 10 and is adapted to be connected to a grounding location in the vehicle, such as the dashboard support.

Figure 2:
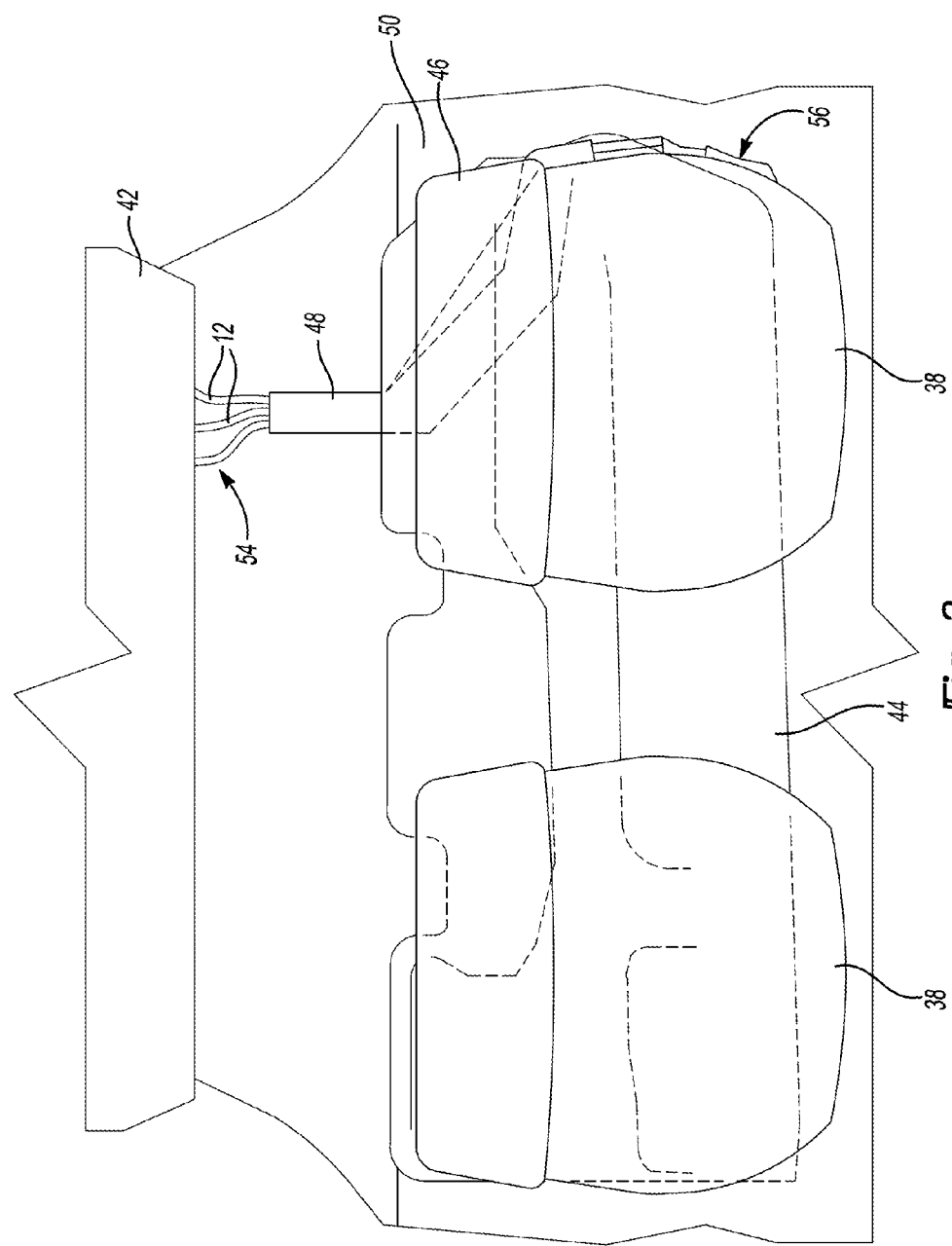
FIG. 2 is a fragmentary top plan view of a rear seat area and a part of a battery housing for a battery electric vehicle.
Figure 3:
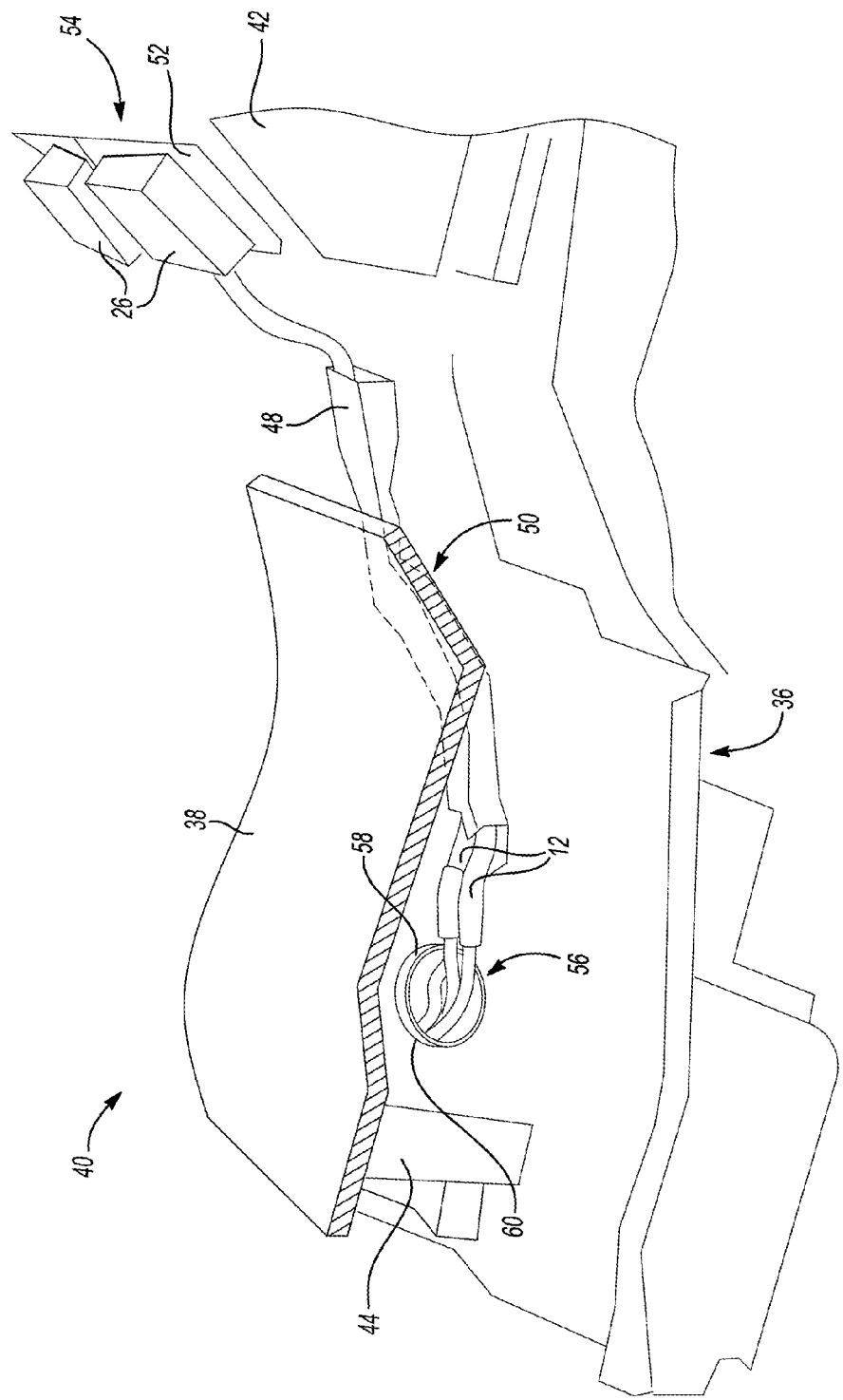
FIG. 3 is a fragmentary partially cross-sectional side perspective view of a rear seat of a vehicle.

Referring to FIGS. 2 and 3, a vehicle 36 is partially shown. Rear seats 38 are shown assembled in the vehicle 36 within the passenger compartment 40. A battery housing 42 is partially shown in FIG. 2 that houses the traction motor battery including the upper battery pack 24 and the lower battery pack 28. The rear seats 38 are attached to a rear seat pedestal 44. A rear seat pan 46 may be assembled to the top of the pedestal 44. The rear seats 38 are assembled on top of the rear seat pan 46. A clamshell shield housing 48 is shown assembled to a rear portion 50 of the pedestal 44. An opening 52 is formed between the passenger compartment 40 and the battery housing 42 through which the power supply cable 10, or the upper battery pack connectors 26, may be connected to the upper battery pack 24 (shown in FIG. 1). The opening 52 is provided in an intermediate location 54 on the battery housing 42. The term "intermediate," as used herein, refers to the portion of the battery housing inboard from the sides of the vehicle and generally behind the rear seat 38.

Referring specifically to FIG. 3, a two-piece grommet 56 is provided in the side of the pedestal 44 to provide a passageway between the passenger compartment 40 and the underbody area of the vehicle 36. The two-piece grommet 56 includes an attachment ring 58 that is a rigid member formed of metal or plastic. Within the attachment ring 58, a seal 60 is provided that forms a seal between the HV wires 12 and the attachment ring 58. Part of the HV wires 12 between the two-piece grommet 56 and the clamshell shield housing 48 and are not enclosed within any housing between the shield and the seal where the HV wires 12 are routed along the side of the seat pedestal 44.

Referring to FIG. 4, a portion of the power supply cable 10 extending between the connectors for the traction motor 18, connectors for the lower battery pack 30 and connectors for the upper battery pack 26 are illustrated. In addition to the HV wires 12, control wires 62 are generally provided to extend between the various components of the BEV system that provide data for controlling operation of the system to the control module (not shown). The portion of the power supply cable 10 shown in FIG. 4 is partially routed through the clamshell shield housing 48 that protects and routes the HV wires 12 and control wires 62 beneath the rear seat. In addition, as shown in FIG. 4, the two-piece grommet 56 is shown to include the attachment ring 58 and a flexible seal 60 that may be formed of a molded elastomeric material. The molded elastomeric material may be molded to the HV wires 12. The clamshell shield housing 48 is assembled about the portion of the wires that extends over the rear seat pedestal as will be described in more detail below.

Referring to FIG. 5, the clamshell shield housing 48 is shown partially in cross-section. The HV wires 12 are shown touching the inside surface of a top wall 64 and a bottom wall 66 of the housing 48. The HV wires 12 are relatively thick and the housing 48 is configured in a generally rectangular shape with the height of the rectangle corresponding to the minimum height necessary to enclose the HV wires 12. In addition to the HV wires 12, control wires 62 are also routed through the housing 48. A right side wall 68 and a left side wall 70 extend between the top wall 64 and bottom wall 66. The side walls 68 and 70 are preferably formed as a first part 72 that includes the top wall 64 and a second part 74 that includes the bottom wall 66. The top wall 64 may be removed from the housing with the first part 72 of the right and left side walls 68 in a clamshell fashion. The two halves of the clamshell housing 48 may be welded together ultrasonically or may be fastened by conventional fasteners as is well known in the art.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
   a rear seat pedestal having a lower portion connected to a floor, a top portion above the floor, and a side portion extending therebetween, wherein the side portion defines an opening providing access into a passenger compartment from an underside of the vehicle;
   a rear seat supported on the seat pedestal and including a seat pan;
   a traction motor positioned in front of the seat pedestal;
   a battery pack positioned completely rearward of the rear seat and above a surface of the floor directly beneath the battery pack so that the battery pack is inside the vehicle;
   a battery cable including a first connector attached to the traction battery, a second connector attached to the traction motor and wires connecting between the connectors, the wires having a first portion located outside the passenger compartment, a second portion located inside a passenger compartment, and a third portion between the first and second portions and extending through the opening, wherein the second portion is routed between the pedestal and the seat pan and the wires are arranged to be coplanar at the second portion; and a housing having a top wall, a bottom wall, and a plurality of side walls cooperating to define an interior enclosing the second portion of the wires, wherein the side walls are limited in height such that the top wall and the bottom wall are in contact with a widest of the wires to minimize the height of the housing.

2. The vehicle of claim 1 further comprising a grommet disposed in the opening to seal between the wires and the seat pedestal.

3. The vehicle of claim 1 further comprising a second battery pack disposed below the seat pedestal, wherein the battery cable further includes a third connector connected to the second battery pack.

4. The vehicle of claim 3 wherein the battery cable includes one or more wires connecting between the battery pack and the second battery pack and extending through the opening.

5. The vehicle of claim 1 wherein the housing is a clamshell structure having a first half and a second half.

* * * * *